United States Patent [19]
Aiello et al.

[11] Patent Number: 6,051,933
[45] Date of Patent: Apr. 18, 2000

[54] BIPOLAR POWER DEVICE HAVING AN INTEGRATED THERMAL PROTECTION FOR DRIVING ELECTRIC LOADS

[75] Inventors: Natale Aiello, Catania; Atanasio La Barbera, Palmero; Sergio Palara, Acicastello, all of Italy

[73] Assignees: SGS-Thomson Microelectronics S.R.L., Agrate Brianza, Italy; Consorzio per la Ricerca sulla Microelettronica nel Mezzogiorno, Catania, Italy

[21] Appl. No.: 08/638,382

[22] Filed: Apr. 26, 1996

[30] Foreign Application Priority Data

Apr. 28, 1995  [EP]  European Pat. Off. .............. 95830167

[51] Int. Cl.⁷ ............................. H05B 37/00; H03K 17/56
[52] U.S. Cl. .................... 315/209 R; 315/224; 327/512; 361/103
[58] Field of Search ..................................... 327/512, 513; 315/225, 226, 224, 200 R, 209 R, DIG. 7; 361/103, 115

[56] References Cited

U.S. PATENT DOCUMENTS

| | | | |
|---|---|---|---|
| 4,677,346 | 6/1987 | Roberts et al. | 315/226 |
| 4,692,688 | 9/1987 | Stanojevic | 323/285 |
| 4,866,350 | 9/1989 | Counts | 315/209 R |
| 4,971,921 | 11/1990 | Fukunaga et al. | 437/29 |
| 5,315,214 | 5/1994 | Lesea | 315/209 R |
| 5,424,897 | 6/1995 | Mietus et al. | 361/91 |

FOREIGN PATENT DOCUMENTS 38 21 460   4/1989   Germany .

OTHER PUBLICATIONS

European Search Report from European Patent Application 95830167.3, filed Apr. 28, 1995.

*Primary Examiner*—David H. Vu
*Attorney, Agent, or Firm*—Wolf, Greenfield & Sacks, P.C.; James H. Morris; Theodore E. Galanthay

[57] ABSTRACT

A monolithically integrated power device for driving electrical loads includes a power stage having a high-voltage bipolar transistor and a low-voltage auxiliary transistor cascade-connected and inserted between a first power supply terminal and a second power supply terminal of the device. The power device also includes a driver circuit for the power stage having an input connected to an input terminal of the device. In accordance with the present invention the device includes a circuit for protection thereof against an excessive temperature rise and controlling power down of the power stage. It includes specifically a temperature sensing circuit which generates a signal dependent on the temperature present in the device, a comparator circuit which receives this signal and compares it with a reference voltage and at least a first switch circuit generating an interdiction signal when the temperature in the device exceeds a preset maximum value and which is interlocked with an output of the comparator circuit and connected functionally through its output to the power stage. The device is advantageously usable in a fluorescent lamp driving circuit, that is to say in the so-called "lamp ballast".

16 Claims, 7 Drawing Sheets

BIPOLAR POWER DEVICE HAVING AN INTEGRATED THERMAL PROTECTION FOR DRIVING ELECTRIC LOADS

BACKGROUND OF THE INVENTION

1. Field of the Invention

The present invention relates to a bipolar power device having an integrated thermal protection for driving electrical loads. In particular the bipolar power device of the invention comprises a power stage including a high-voltage bipolar transistor and a bipolar or MOS type low-voltage auxiliary transistor connected in cascade. A circuit for driving the power stage is also included in the device.

By way of non-limiting example explicit reference is made in the following description to a fluorescent lamp or tube driving system comprising a pair of power devices of the type described above.

2. Discussion of the Related Art

As well known, power devices are normally used for driving electrical loads. In numerous applications and within the scope of the present invention a power device includes a three-terminal integrated component.

The present invention relates in particular to a bipolar power device. This type of device is used e.g. for high-voltage applications, even on the order of hundreds of volts and in which a MOS power device cannot be used. A preferred application of this three-terminal device is e.g. a fluorescent lamp or tube driving system.

In the power device are normally integrated monolithically a power stage and a corresponding driver circuit which controls power up and power down of the power stage depending on an applied external signal.

One shortcoming which can occur during operation of a power device is accidental temperature rise inside the device. This temperature rise can be due to a multiplicity of causes. For example, malfunctioning of the circuit driving the power stage causes excessive power dissipation and hence a further temperature rise. Sometimes damage of the cooling system, or more simply temperature increase in the surrounding due to the presence of heat sources, produces a substantial internal temperature increase. Operation of the device in these cases can be compromised. Sometimes damage is such as to make the power device unusable.

In the area of three-terminal bipolar power devices, to protect against excessive temperature rise so as to avoid the above mentioned shortcomings, apparatuses external to the device are commonly used. In a fluorescent lamp or tube driving system, a mechanical protection device, known to those skilled in the art as solder spot is used. The solder spot includes a mechanical apparatus mounted on the power device package. Usually this apparatus consists of a pair of facing metal reeds having a known thermal behavior and is placed above the heat sink connected thermally to the device. The mechanical apparatus acts as a temperature sensor and as a protection. Upon reaching an alert temperature, i.e. as soon as the temperature in the power device exceeds a predetermined maximum value, it intervenes to disconnect a power supply terminal of the device from the electrical power line of the system.

This type of thermal protection exhibits however numerous drawbacks, e.g. poor accuracy of the operating temperature and slow intervention. In addition, the protection apparatus increases the overall dimension of the power device and contributes to increasing considerably the cost of the system for the user.

SUMMARY OF THE INVENTION

Therefore, an object of the present invention is to provide a bipolar power device having precision and speed of operation as soon as the temperature exceeds a predetermined maximum value and at the same time effective under any operating conditions and for any application, e.g. for a fluorescent lamp driving circuit.

One purpose of the present invention is also that of achieving a thermal protection for the bipolar power device permitting reduction of the space occupied by the device and drastic reduction of application costs.

In accordance with the present invention a monolithically integrated power device for driving electrical loads comprises a power stage including a high-voltage bipolar transistor inserted between a first power supply terminal and a second power supply terminal of the device and having at least one control terminal. In particular the power stage also comprises a low-voltage auxiliary transistor cascade connected to said high-voltage transistor. This auxiliary transistor can be either MOS or bipolar without distinction. The power device also comprises a driver circuit of the power stage having at least one output connected to the power stage control terminal and an input connected to an input terminal of the device.

In accordance with the present invention the device includes a circuit for protection thereof against excessive temperature rise.

The thermal protection circuit controls power down of the power stage. It comprises specifically a temperature sensing circuit which generates at its output a signal dependent on the temperature present in the device, a comparator circuit which receives this signal and compares it with a reference voltage and at least a first switch circuit which generates an interdiction signal when the temperature in the device exceeds a predetermined maximum value and is interlocked with an output of the comparator circuit and functionally connected through its output with the power stage. In practice the first switch circuit is preferably connected to the low-voltage auxiliary transistor.

In accordance with a preferred embodiment of the present invention, the thermal protection circuit comprises in addition a second switch circuit inserted between the comparator circuit output and a control node of said driver circuit and interlocked with the output of the comparator.

In accordance with the present invention in addition in the device preferably the driver circuit and the thermal protection circuit are both fed by said input terminal.

Preferably in the device the reference voltage is generated by a circuit also integrated inside it. This circuit can be of the type already used commonly in the prior art for generating a voltage independent of temperature.

According to one embodiment of the invention, there is provided a monolithically integrated bipolar power device for driving electrical loads including:

a power stage including a high-voltage bipolar transistor inserted between a first power supply terminal and a second power supply terminal of the device, and having at least one control terminal, a driver circuit of the power stage having at least one output connected to the control terminal of the power stage and an input connected to an input terminal of the device, and a thermal protection circuit incorporating:
  a) a temperature sensing circuit for generating a signal dependent on the temperature present in the device, b) a comparator circuit having a first input connected to the temperature sensing circuit to receive said signal, a second input connected to a node kept at a reference potential independent of temperature and at least one output, and c) at least a first switch circuit connected between said output of the comparator circuit and the control terminal of the power stage and interlocked with the output of the comparator to generate at its output a cut off signal when the device temperature exceeds a preset maximum value.

According to another embodiment of the invention, the power stage includes a low-voltage auxiliary transistor cascade-connected to said high-voltage transistor, wherein the first switch circuit is connected to a control node of the auxiliary transistor.

According to another embodiment of the invention, a second switch circuit is inserted between the output of the comparator circuit and a control node of the driver circuit and interlocked with the output of the comparator.

According to another embodiment of the invention, the driver circuit includes, between the input terminal of the device and the auxiliary transistor, means for decoupling the auxiliary transistor from said terminal when a predetermined voltage is applied on the terminal, the means having a control node connected to a control node of the driver circuit.

According to another embodiment of the invention, the means for decoupling comprise at least one switch connected to a control node of the auxiliary transistor and having a control node coupled to said control node of the driver circuit.

According to another embodiment of the invention, the second switch circuit is fed through the input terminal of the device.

According to another embodiment of the invention, the first switch circuit and said second switch circuit include respective input transistors interlocked with respective outputs of said comparator circuit and respective output transistors controlled by said input transistors and connected respectively to the control node of the auxiliary transistor and to a control node of said driver circuit.

According to another embodiment of the invention, the temperature sensing circuit and the comparator circuit are incorporated in a single differential stage.

According to another embodiment of the invention, the differential stage includes first and second branches connected between the node kept at the reference potential and said second and first switch circuits and having respective junctions defining potential drops variable with temperature and connected in parallel between the node kept at the reference potential and a constant voltage terminal, in such a manner that the first and second branches switch to conduction when the temperature of the device exceeds the preset maximum value.

According to another embodiment of the invention, the device includes a circuit for generating at the node the reference potential independent of temperature.

According to another embodiment of the invention, the circuit for generating the reference potential is of the bandgap type.

According to another embodiment of the invention, the circuit comprises a current mirror fed by the input terminal of the device and having an input branch receiving a first current proportional to an input current and an output branch through which flows a second current proportional to the first current, and a transistor controlled by the second current and connected to a reference node, wherein the variation with the temperature of the difference between the base-emitter voltages of said current mirror is such as to compensate for the variation with the temperature through the base-emitter junction of the transistor in such a manner that the potential present on said reference node is independent of temperature.

According to another embodiment of the invention, the driver circuit and the thermal protection circuit are fed by the input terminal.

According to another embodiment of the invention, there is provided a circuit for driving a fluorescent lamp including:

a transformer having a primary winding in series with the lamp and a first and second secondary windings, first and second bipolar power devices for driving the lamp, both connected in series between a first and second power supply lines and connected in parallel respectively with the first and the second secondary windings, an intermediate terminal between said bipolar power devices being connected to said primary winding, and a striking circuit functionally connected to the first and second power device to activate them, a power stage including a high-voltage bipolar transistor inserted between a first power supply terminal and a second power supply terminal of the device, and having at least one control terminal, a driver circuit of the power stage having at least one output connected to the control terminal of the power stage and an input connected to an input terminal of the device, and a thermal protection circuit incorporating:
  a) a temperature sensing circuit for generating a signal dependent on the temperature present in the device,
  b) a comparator circuit having a first input connected to the temperature sensing circuit to receive said signal, a second input connected to a node kept at a reference potential independent of temperature and at least one output, and
  c) at least a first switch circuit connected between said output of the comparator circuit and the control terminal of the power stage and interlocked with the output of the comparator to generate at its output a cut off signal when the device temperature exceeds a preset maximum value.

The characteristics and advantages of the power device in accordance with the present invention are set forth in the description of an embodiment thereof given below by way of nonlimiting example with reference to the annexed drawings.

DETAILED DESCRIPTION

Figure 1:
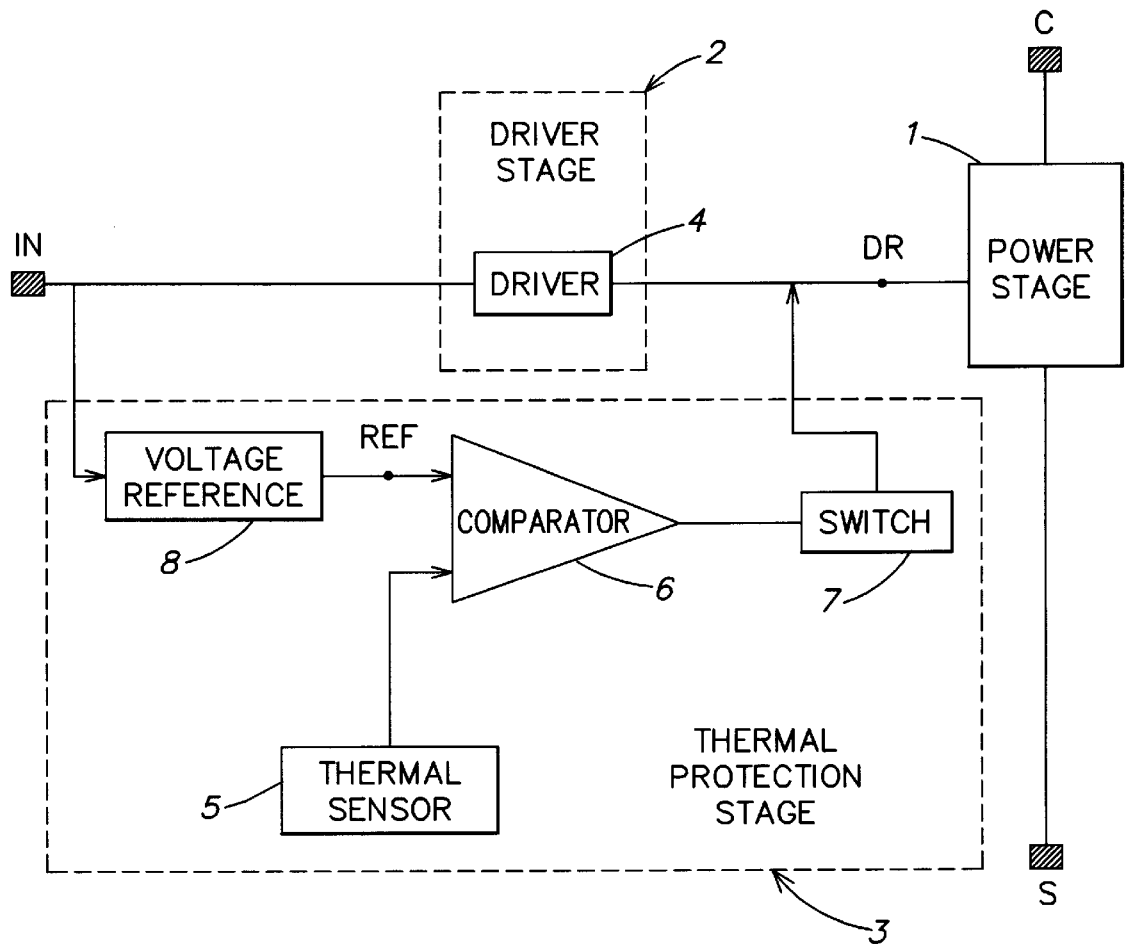
FIG. 1 shows a block diagram of a bipolar power device with integrated thermal protection in accordance with the present invention.

FIG. 1 shows a general block diagram of a bipolar power device with thermal protection for driving electrical loads and provided in accordance with the present invention. The device is monolithically integrated and has three terminals for electrical connection, namely first and second power supply terminals and an input terminal respectively indicated by the letters C, S and IN.

The device comprises a bipolar power stage, indicated in the figure by block 1, which carries out the function of driving an electrical load connected thereto. The power stage 1 is inserted between the first power supply terminal C and the second power supply terminal S. A control terminal DR of the power stage permits its driving. The control terminal DR can represent e.g. the base terminal of the power transistor.

Included in the device and connected to the power stage, and specifically to the control terminal DR of that stage, is another logic circuitry which establishes and controls the power up and power down of the power stage.

The logic circuitry comprises a driver stage 2 which establishes completely the electrical state of conduction or interdiction of the power stage under non-critical temperature operating conditions. The driver stage 2 comprises a driver circuit 4 and is inserted between the control terminal DR of the power stage 1 and the input terminal IN in such a manner as to couple the power stage to the above mentioned input terminal.

In accordance with the present invention, integrated monolithically in the device is a thermal protection circuit, enclosed by the broken line indicated in the FIG. 1 by reference number 3. The thermal protection circuit 3 acts functionally on the power stage 1 and in the preferred embodiment of the present invention shown in FIG. 1 is fed by the input terminal IN. The function of the thermal protection circuit is to permit self-power down of the device.

In the thermal protection circuit 3 are specifically included the following circuit blocks, namely a temperature sensing circuit 5, a comparator circuit 6, a block representing at least one switch circuit 7 and a circuit 8 for generating a reference potential VREF.

The temperature sensing circuit 5 generates at its output a voltage signal dependent on the temperature present in the device. Preferably this signal is chosen in such a manner as to change linearly with temperature. Commonly in accordance with the prior art, the temperature dependence of the voltage drop at the ends of a directly biased base-emitter junction of at least one transistor integrated in the circuit and used as a sensor is utilized, as explained below.

The comparator circuit 6 has a first input connected to the sensing circuit 5 to receive the above mentioned temperature-dependent signal, a second input connected to a node REF of the device kept at the reference potential VREF. The comparator circuit 6 also has an output connected functionally to the switch circuit 7.

The switch circuit 7 is inserted between the output of the comparator circuit 6 and the control terminal DR of the power stage 1 and is interlocked with the output of the comparator circuit to control power down of the power stage.

In accordance with the present invention in addition preferably the driver circuit 4 and the thermal protection circuit 3 are both fed by the input terminal IN.

As shown in FIG. 1 the circuit 8 generates inside the device the reference potential VREF independent of the temperature through an output thereof connected to the node REF. Power supply of the circuit 8 takes place preferably from the input terminal IN of the device.

The power device operates as follows.

During use of the device, to one of the two power supply terminals C and S is usually applied a constant voltage, while on the other is normally applied a load. To the input terminal IN is applied a variable external signal. The driver circuit 4 controls alternately power up and power down of the power stage 1 depending on the signal applied to the input terminal IN. When the signal received by the driver circuit from the input terminal IN takes on a maximum value, i.e. for example is positive, the driver circuit supplies a current to the control terminal DR, i.e. to the base of the power transistor which in this case is put on. On the contrary if the signal at the input terminal IN has a minimum value, i.e. for example the terminal is applied a zero or negative potential, the power transistor is switched off.

Under normal operating conditions, i.e. as long as the temperature does not exceed a predetermined maximum value, the thermal protection circuit 3 is off and does not influence operation of the power stage 1, which is completely determined by the driver circuit 4. Indeed, the value of the voltage generated by the temperature sensing circuit 5, and applied in particular to the first input of the comparator, is greater than the constant reference value VREF present at the node REF. The output of the comparator circuit 6 is therefore high.

If the temperature increases accidentally, the value of the signal generated by the temperature sensing circuit 5 and variable monotonically with the temperature decreases gradually and gets near the reference value VREF. When the temperature reaches a maximum preset value, the comparator circuit 6 switches and causes intervention of the thermal protection circuit 3.

The temperature sensing circuit 5 parameters are chosen in such a manner that exactly corresponding to said temperature value the value of the voltage generated by the circuit equals the value of the reference voltage preset and generated by the reference circuit 8. When the two voltage values are equal, both the inputs of the comparator circuit 6 are at the same potential and the circuit 6 switches. The comparator circuit 6 in turn takes into conduction the switch circuit 7. The latter has the function of turning off the power stage 1, by generating an interdiction signal and applying it to the control terminal DR.

Within the scope of the present invention, the bipolar power stage is advantageously of the type comprising a high-voltage bipolar transistor and a low-voltage auxiliary transistor cascade-connected. This low-voltage auxiliary transistor, which facilitates driving of the high-voltage transistor, can be either MOS or bipolar. It is to these configurations denominated commonly "emitter-switching" that the present invention relates.

Figure 2:
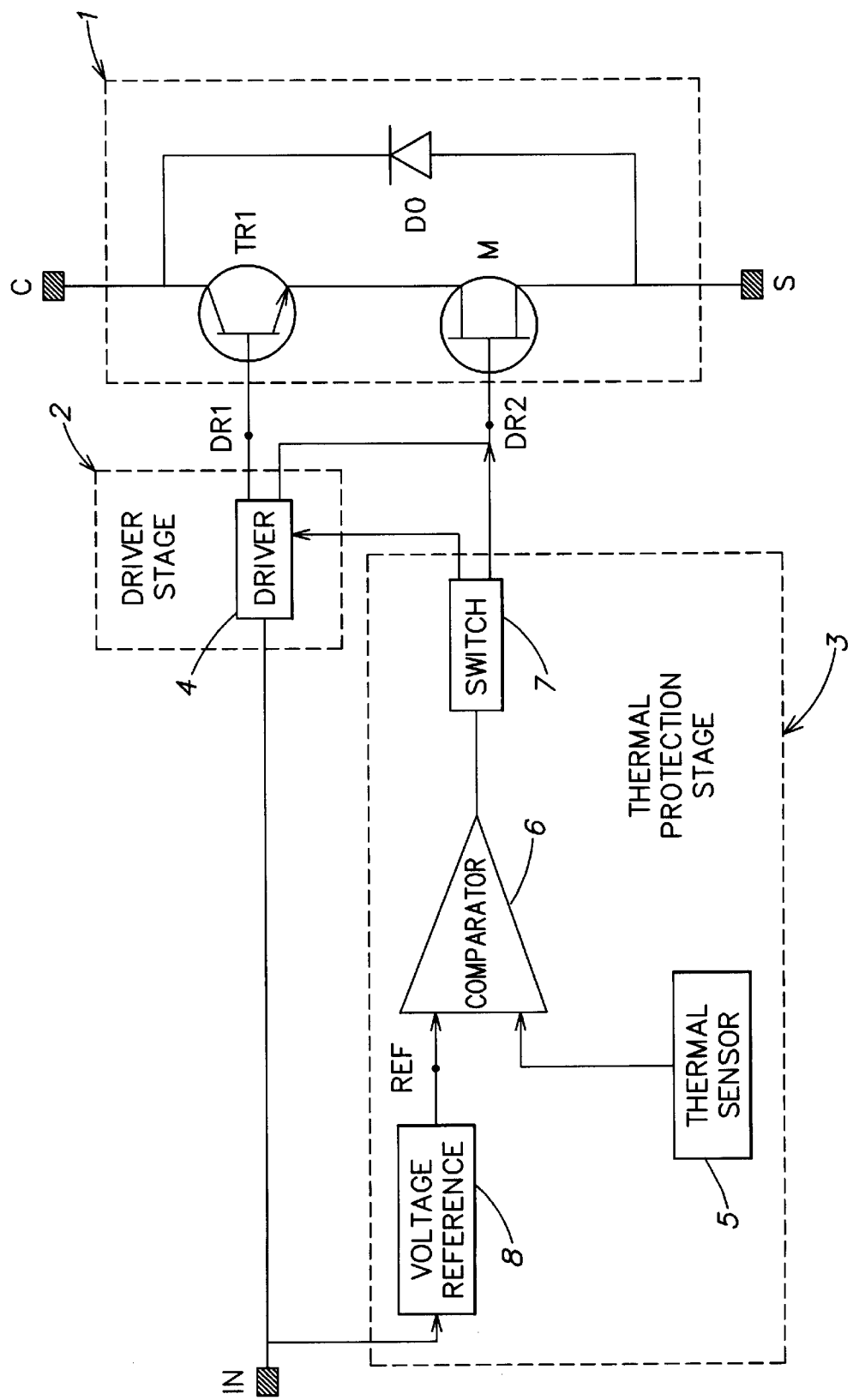
FIGS. 2 and 3 show block diagrams of the power device in accordance with the present invention, in which the power stage comprises a high-voltage bipolar transistor connected in cascade with a low-voltage auxiliary transistor.
Figure 3:
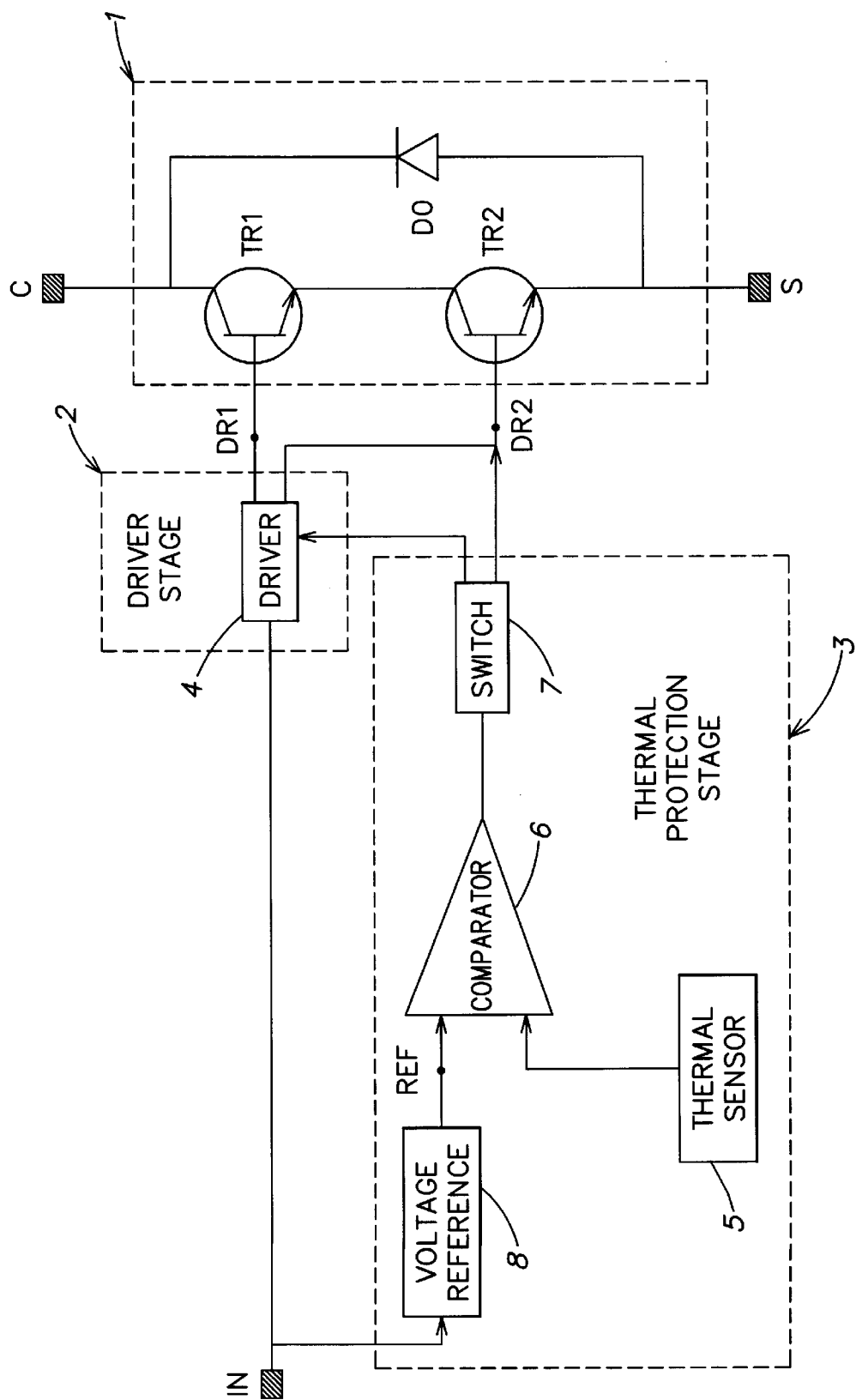

With reference to FIGS. 2 and 3 there are shown in order the two above mentioned cases for implementing the power stage 1. In these FIGS. are shown the same reference numbers and symbols as in FIG. 1 for equal blocks and elements.

As shown in these FIGS. the power stage 1 includes an NPN bipolar power transistor TR1 and a low-voltage MOS transistor or a low-voltage bipolar transistor, indicated by M and TR2 respectively in FIG. 2 and FIG. 3. The two transistors are inserted in cascade between the first and the second power supply terminals, C and S, of the device. A diode DO is also connected in reverse bias between the first and second power supply terminals, C and S, in parallel with said transistors.

As may be seen in FIGS. 2 and 3 the power stage 1 includes in practice two control nodes, namely a first control node DR1 constituted by the base of the power transistor TR1 and another control node identified by the symbol DR2 which coincides with the auxiliary transistor control node, respectively the gate of the transistor M or the base of the transistor TR2.

The driver circuit 4 acts functionally on both the transistors of the power stage. Indeed it is connected through its output to both the control nodes DR1 and DR2 of the related transistors. Power up and power down of the two transistors are controlled simultaneously by connecting their control nodes DR1 and DR2 to the power supply terminal through the driver circuit 4. In other words the latter supplies the current in the base necessary for turning on the bipolar transistors TR1 and TR2, or it permits the charge of the transistor gate M, when the potential applied to the input terminal IN takes on a positive value.

The functional connections of the thermal protection circuit 3 and in particular of the final block which exercises control over the power stage 1, i.e. of the switch circuit 7, are shown specifically in FIGS. 2 and 3.

In practice the switch circuit 7 directly controls power down of the auxiliary transistor, since it is connected through a first output thereof to the control node DR2. It is noted that advantageously power down of the power stage takes place specifically by taking into interdiction the auxiliary transistor and not the power transistor directly. This allows decreasing the switching time of the device.

In accordance with a preferred embodiment of the present invention as shown in FIGS. 2 and 3 and differently from the generic diagram of FIG. 1 the switch circuit 7 also has a second output functionally connected to the driver circuit 4. The interdiction signal supplied by the switch circuit 7 if the internal temperature of the device reaches the above mentioned maximum predetermined value, as discussed above, for turning off the power stage 1, acts therefore both on the auxiliary transistor TR2 or M and on the driver circuit 4. In this manner a double control is exercised.

Anyway in principle it would suffice that the switch circuit 7 acts directly only on the power stage 1, even though in this case it would be necessary to oversize the thermal protection circuit 3 to allow for the current which in any case would be supplied by the power supply terminal IN through the driver circuit 4 turned on.

The configuration shown in FIG. 2 in which the auxiliary transistor is of the MOS type, is particularly advantageous. The auxiliary transistor M allows achieving high performance in the transitory phases, i.e. at the moment the power stage 1 is switched on or off.

In comparing the embodiment of FIG. 3, containing in the power stage 1 a bipolar transistor TR2, with the configuration containing the MOS transistor M of FIG. 2, the following phenomena should be considered. Current absorption by the input terminal for driving the power stage 1 is greater in the former case because in order to turn on the transistor TR2 it is necessary to supply to its base a not negligible driving current. In addition there must be considered the so-called storage time for the transistor TR2, i.e. time for storing the charge at the related control node.

With particular reference to a preferred embodiment of the driver stage 2 and the thermal protection circuit 3, in FIGS. 4a, 4b, 5, 6 and 7 the individual blocks are shown separately for clarity.

Figure 4A:
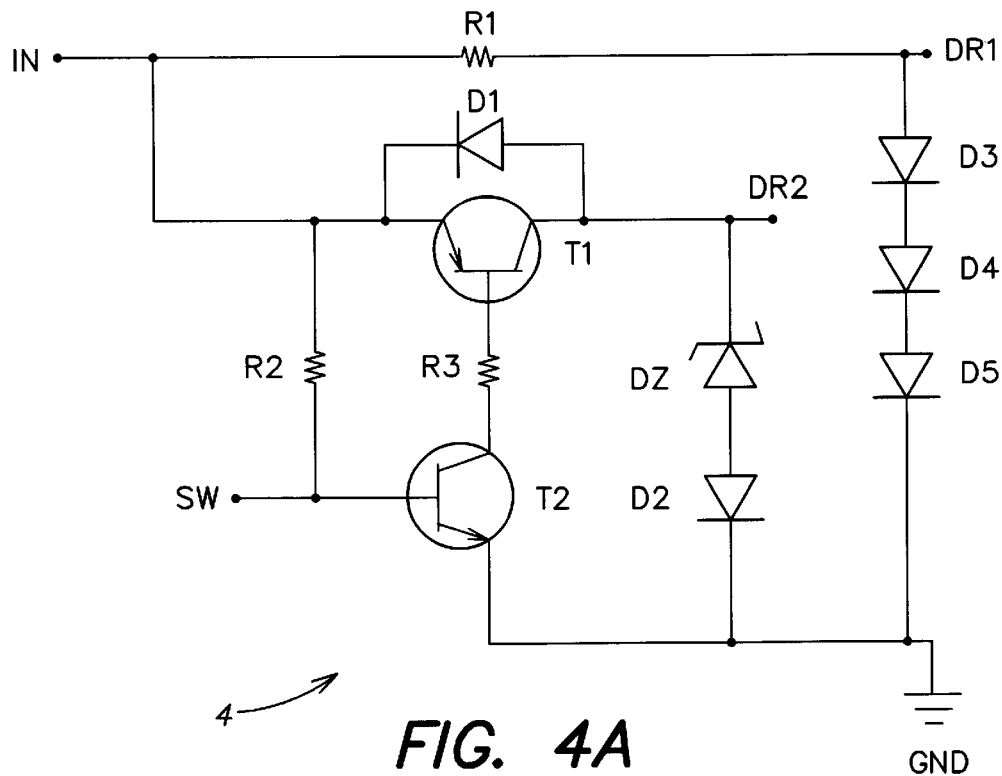
FIGS. 4a and 4b show two embodiments of the driver circuit respectively for the two power stages diagrammed in FIGS. 2 and 3, respectively.
Figure 4B:
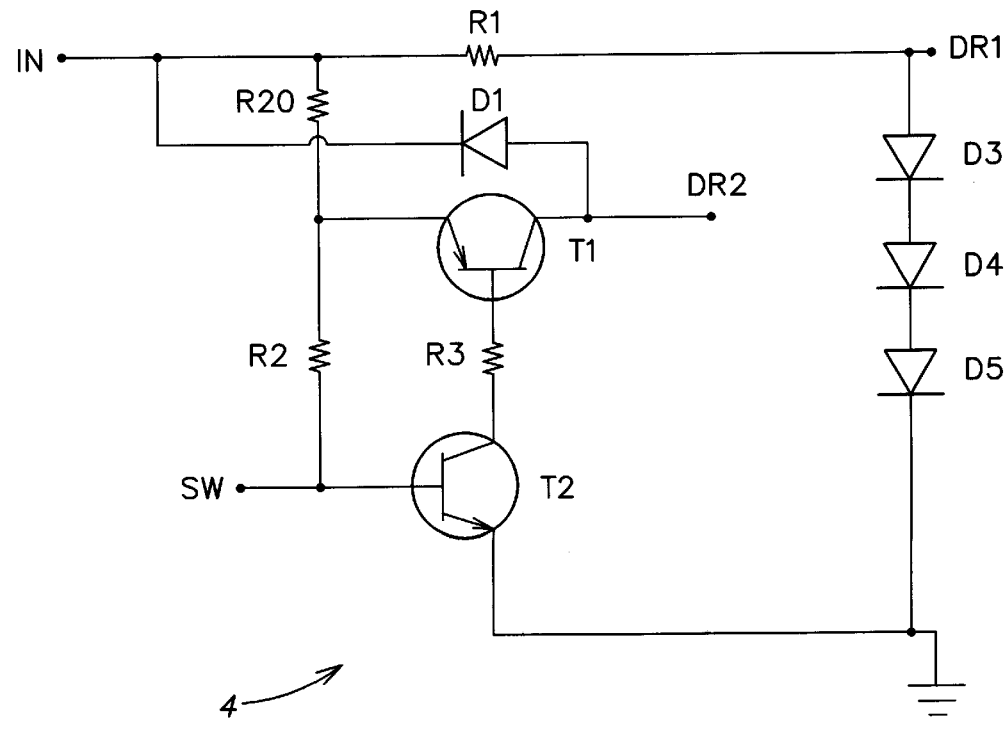

In FIGS. 4a and 4b are shown electrical schematic diagrams of a driver circuit indicated as a whole in the previous FIGS. by reference number 4. FIG. 4a relates precisely to a preferred embodiment for the case of the auxiliary transistor M, while FIG. 4b shows an adaptation of the same embodiment to the case where the auxiliary transistor (TR2) is bipolar.

With reference to FIG. 4a the driver circuit 4 comprises a resistor R1 connecting the base DR1 of the power transistor TR1 (not shown in this FIG.) to the input terminal IN. To drive the auxiliary transistor M the driver circuit 4 in the preferred embodiment includes a pnp transistor T1 inserted between the control node DR2 of the transistor and the input terminal IN of the device. To a control node of the transistor T1 are connected a resistor R3 and an npn transistor T2. Another resistor R2 is inserted between the input terminal IN and a control node SW of the driver circuit 4, to which is also connected a base terminal of the transistor T2. The resistors R2 and R3 and the transistors T1 and T2 allow driving of the auxiliary transistor M.

Differently from FIG. 4a, FIG. 4b comprises another resistor R20 in series with the transistor T1 and inserted in series with the resistor R2 between the input terminal IN and the control node SW of the driver circuit 4. The presence of this resistor allows accurate regulation of the current supplied to the base terminal DR2 of the bipolar transistor TR2 by the input terminal IN.

The driver circuit 4 of FIGS. 4a and 4b keeps on the high-voltage bipolar transistor TR1 and the low-voltage auxiliary transistor TR2 or M, when an adequate positive voltage is applied to the input terminal IN of the device. The current at the base DR1 of TR1 is supplied through the resistor R1. The base of T2 is connected to the terminal IN through the resistor R2 and receives a current such as to take it into saturation. Once T2 is turned on, through R3 flows a current which switches T1 on. The control node DR2 is thus at the potential of the terminal IN without the saturation voltage of T1 in the case of auxiliary MOS transistor M, while it is at the conduction potential of the transistor T1 in case of a bipolar auxiliary transistor, i.e. TR2. Consequently the auxiliary transistor is turned on.

In FIG. 4a furthermore the presence of the diodes D2 and DZ which are connected respectively in forward and reverse bias between the control node DR2 of the auxiliary transistor M and the ground node GND permits protection of the transistor from possible overvoltages.

If the power device is used e.g. in a fluorescent lamp driving system in which, as clarified below in detail, two equal power devices operate alternately, during a certain length of time the power device must be turned off. In this case on the input terminal IN is applied a potential less than or equal to zero. The high-voltage bipolar transistor TR1 no longer receives current at its base terminal DR1. On the other hand the auxiliary transistor is off because the node DR2 is grounded. The charge accumulated at the node DR2 discharges through the diode D1, which is connected in parallel with the transistor T1 and which prevents the node DR2 from keeping the potential of the input terminal IN reached during turn-on phase. Advantageously turn off of the auxiliary transistor consequently causes switch off of the high-voltage transistor TR1 which therefore takes place more rapidly. Elimination of the charge at the base DR1 of TR1 accumulated during the previous on phase is made even faster by the diodes D3, D4 and D5, connected in series between the base node DR1 and ground GND. In FIGS. 4a and 4b are shown three of these diodes but their number could of course be different.

The control node SW of the driver circuit 4 together with the node DR2 of the auxiliary transistor is the point where the thermal protection circuit 3 takes effect.

It should be remembered that the circuit elements T1, T2, R2 and R3, inserted between the control node DR2 of the auxiliary transistor and the input terminal IN, and in particular the transistor T1, perform the function of decoupling the transistor from the above mentioned terminal. This permits facilitating and speeding up power down of the device in case of excessive temperature increase, as better described below, even if on the input terminal IN there is the above mentioned maximum voltage. However an equivalent circuit could be provided differently although with the same purpose. For example the transistor T1 which fulfils the role of directly controlling switch on of the auxiliary transistor could be replaced by a generic switch fed by the input terminal IN and coupled to the control node SW of the driver circuit.

Figure 5:
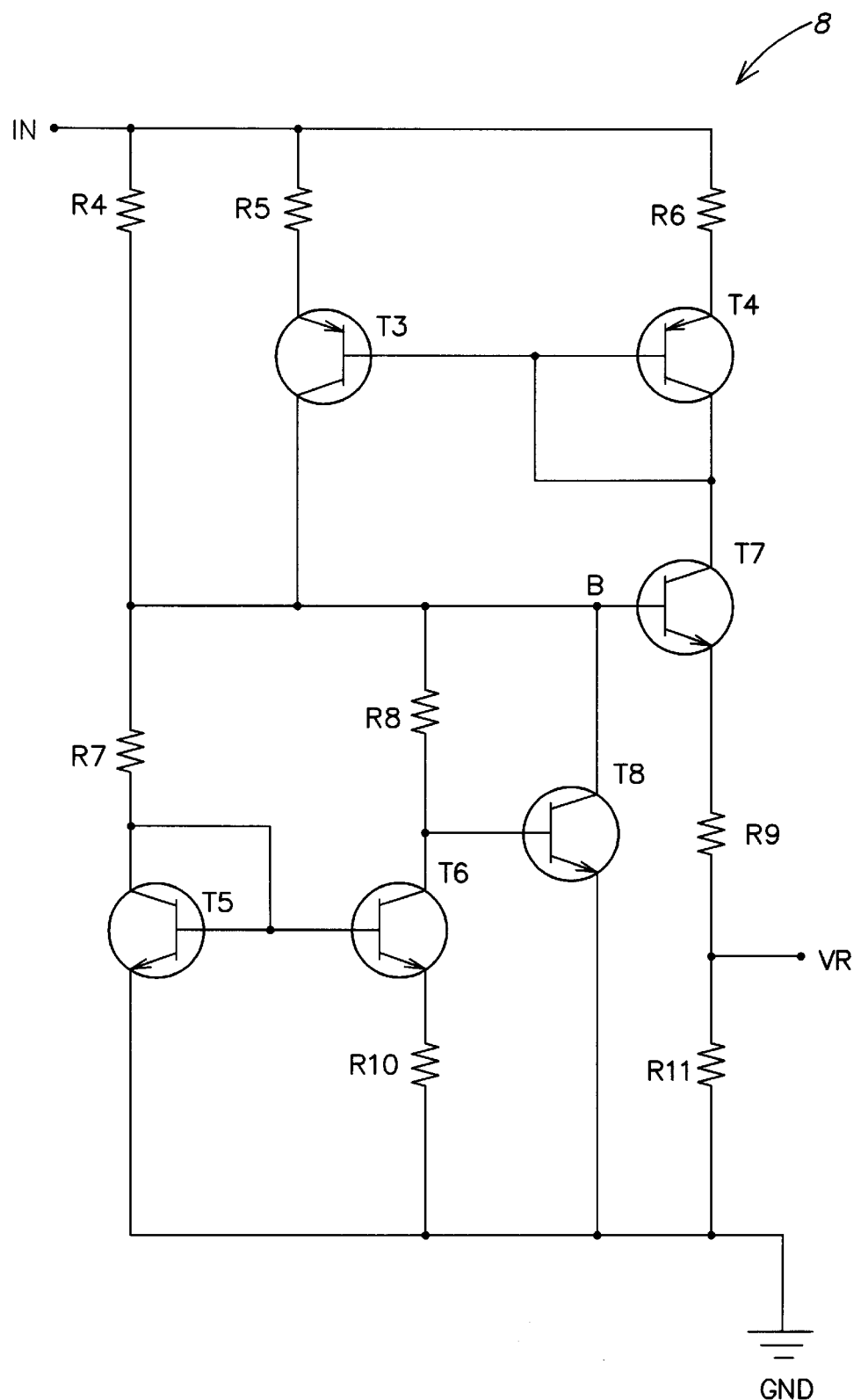
FIG. 5 shows a preferred embodiment of a circuit for generating a reference potential independent of temperature.
Figure 6:
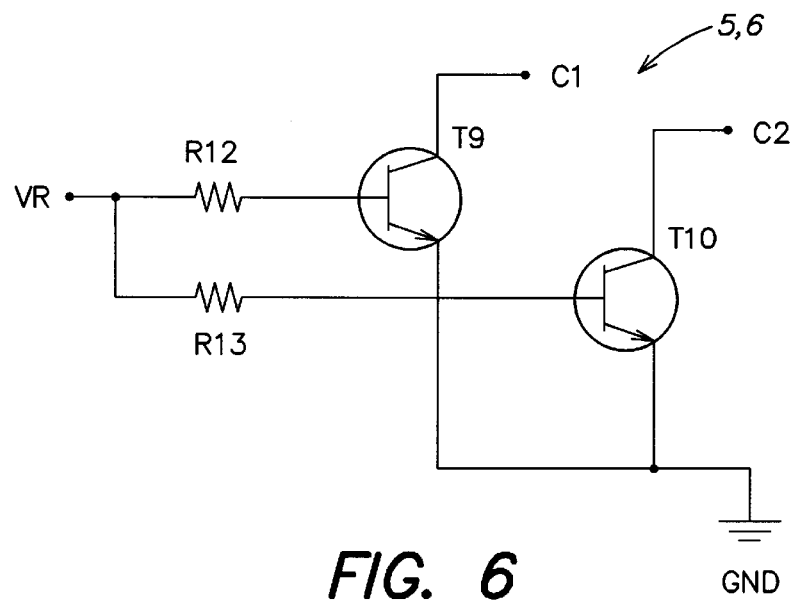
FIG. 6 shows a preferred embodiment of a sensing circuit and a comparator circuit.
Figure 7:
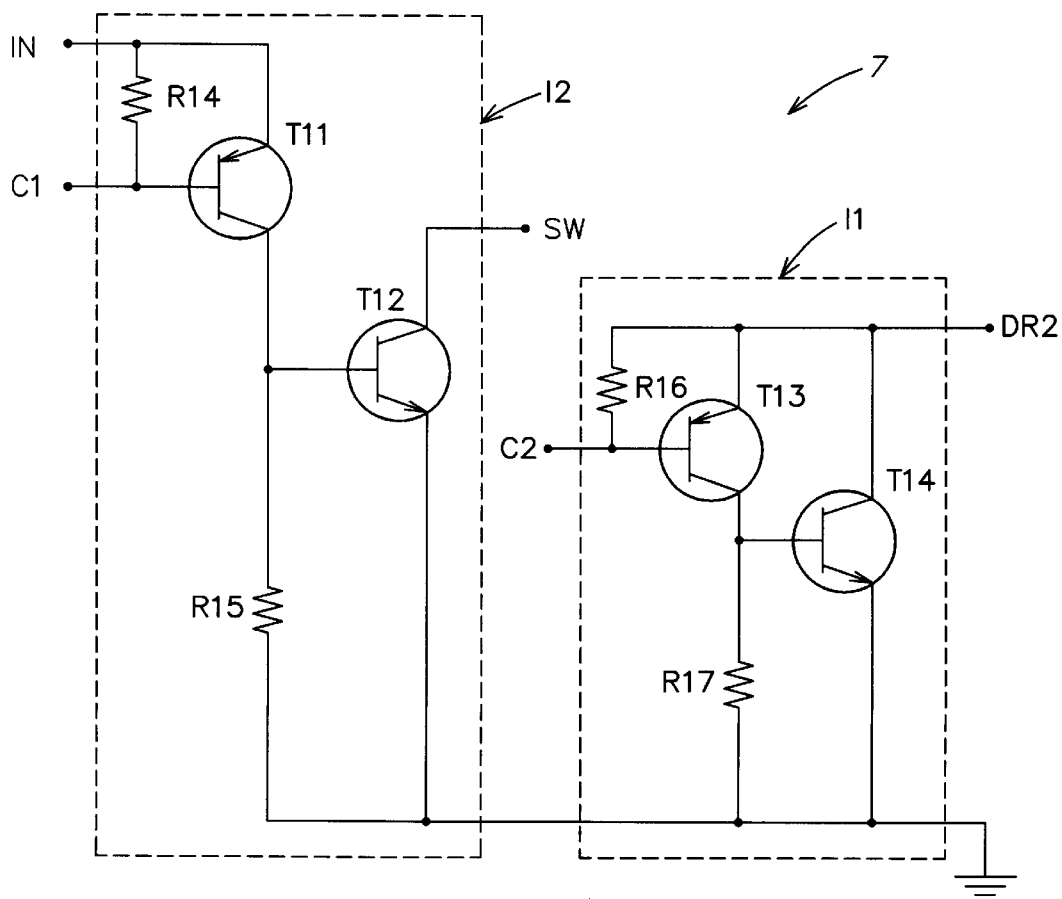
FIG. 7 shows an electrical diagram of a first and second switch circuits.

The preferred embodiment of the blocks making up the thermal protection circuit 3 is shown in FIGS. 5, 6 and 7.

In the preferred embodiment illustrated in FIG. 5 a circuit 8 for generating a reference potential in accordance with the present invention is of the so-called band(gap type, commonly used in the present-day art. It supplies to the node VR a steady voltage independent of temperature and also independent of input voltage. The circuit 8 is fed by the input terminal IN through an input stage comprising a current mirror T3–T4 and the resistors R4, R5 and R6.

Compensation for the voltage with temperature change takes place by means of a current mirror T5–T6 and a transistor T8. The base-emitter voltage VBE of the transistor T8 varies with temperature in accordance with a known relation. On the other hand as known the difference between the base-emitter voltages of two transistors configured as current mirrors varies inversely to the temperature. In the case of FIG. 5 the transistors T5 and T6 are realized appropriately with different values of VBE.

The potential at the base B of the transistor T7 represents the adjusted voltage. In particular this voltage depends on the base-emitter voltage of the transistor T8 and on the potential drop on the resistor R8. This last potential drop is dependent on the resistor value of R8 and on the current flowing through it, which in turn depends on the difference between the VBEs of the transistors T5 and T6 and on the value of the resistor R10. Temperature compensation takes place by choosing appropriately the parameters in such a manner as to achieve a value independent of temperature.

The voltage is however effectively drawn from the generator circuit 8 at the output node VR. This voltage represents therefore a partition, through the divider including the resistors R9 and R11, of the voltage at the node B without the base-emitter potential drop of the transistor T7. The node VR permits having advantageously an output with lower impedance and therefore better suited to driving of successive circuit blocks.

The circuit shown in FIG. 5 is shown by way of example but could easily be modified by one skilled in the art.

The power device in accordance with the present invention allows effective integration of a very simple bandgap circuit like the one described above.

FIG. 6 shows the electrical diagram of a temperature sensing circuit 5 and a comparator circuit 6. In the preferred embodiment the two circuit blocks 5 and 6 can be incorporated together in a single differential stage. The sensor/comparator circuit of FIG. 6 includes two identical branches connected through the stable node VR and respectively a first and second outputs C1 and C2. The reference voltage generated by the circuit 8 and illustrated, e.g. in FIG. 5, is applied by means of the resistors R12 and R13 to the bases of the transistors T9 and T10. The emitters of the two transistors are connected to ground i.e. to the node GND. On the other hand the base-emitter junctions of the transistors T9 and T10 define potential drops equal and variable with the temperature present in the device. This potential drop value is compared with the voltage predetermined by the generator circuit 8 at the ends of the junctions. When the two values are equal the two branches are activated. The transistors T9 and T10 therefore carry out the dual function of thermal sensor and comparator. The reference voltage value is chosen appropriately to take into conduction the above mentioned transistors when the temperature in the device reaches the maximum preset value.

The circuit illustrated in FIG. 6 represents an embodiment of the blocks 5 and 6 particularly advantageous and simple to implement.

FIG. 7 shows a first and second switch circuits I1 and I2 indicated above as a whole in FIGS. 2–3 with the single functional block 7 as described above in detail.

The first switch circuit I1 is inserted between the second output C2 of the sensor/comparator circuit and the control node DR2 of the auxiliary transistor. It acts on the auxiliary transistor to cause its interdiction in case of an excessive temperature increase, as explained below. The first switch circuit I1 comprises a pair of transistors T13 and T14 driven in succession by the node C2. The second switch circuit I2 is inserted between the first output C1 of the sensor/comparator circuit and the control node SW of the driver circuit 4 to control its power down under critical temperature conditions. The switch circuit I2 is provided in a manner similar to that of the switch circuit I1 and comprises the transistors T11 and T12. Preferably the switch circuit I2 is also fed from the input terminal IN of the device.

It is observed that the circuit diagram of FIG. 7 includes both the switch circuits. The necessity of implementation of both the switch circuits within the scope of the present invention has already been discussed above.

Operation of the thermal protection circuit as achievable from the combination of the circuit representations of the FIGS. 4a or 4b, 5, 6 and 7 if the device temperature reaches the above mentioned critical value is as follows. When the threshold voltage of the sensor/comparator circuit which decreases with temperature by a known relation equals the value of the reference potential VR the transistors T9 and T10 go into conduction together and simultaneously. At this point the first and second switch circuits I1 and I2 are turned on. In particular the turn on of the transistor T9 causes conduction of the transistor T11 which supplies to T12 a current sufficient to take it into saturation. On the other hand from the turn on of the transistor T10 there follows that of the transistor T13 which supplies to the transistor T14 a current sufficient to send it into saturation. The transistor T12 of the second switch circuit I2 acts on the driver circuit 4 and specifically on the transistor T2 to take it into interdiction. In this manner connection of the control node DR2 of the auxiliary transistor TR2 or M with the input terminal IN is interrupted because of the turning off of T1 resulting from interdiction of the transistor T2. The transistor T14 which represents the output of the first switch circuit also acts on the node DR2 to cause interdiction of the auxiliary transistor.

Switch off of the bipolar power transistor TR1 is caused by the interdiction of the auxiliary transistor TR2 or M and not directly by the logic circuitry.

Attention is drawn to the presence in the driver circuit 4 of circuit elements allowing rapid discharge of the charges present at the base of the power transistor TR1. These permit improvement of the switching times for self-power down of the device under critical temperature conditions even when the voltage applied to the input terminal IN is not zero.

Figure 8:
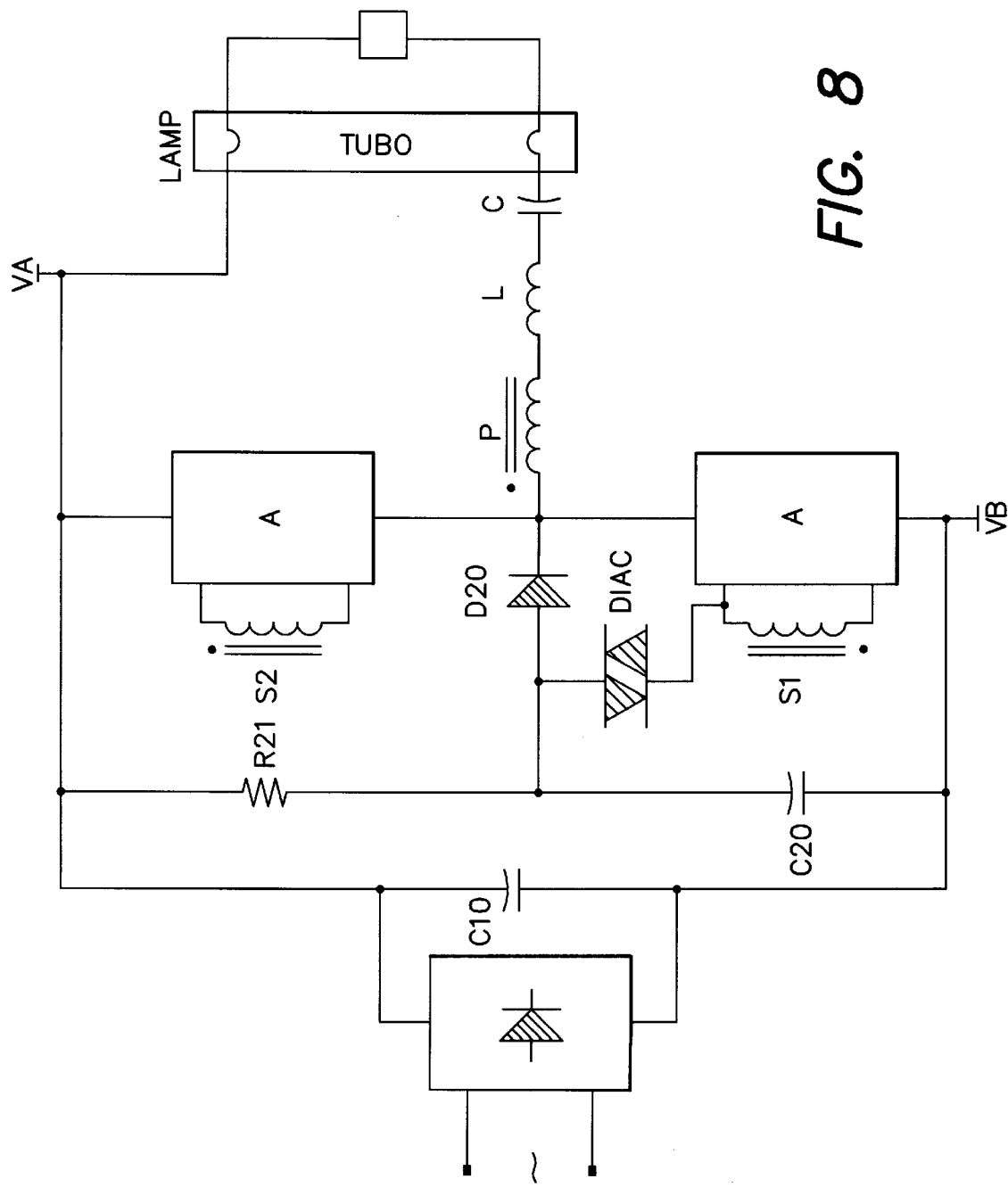
FIG. 8 shows an application of the device in accordance with the present invention to a fluorescent lamp driving system.

FIG. 8 shows a preferred embodiment of application of the bipolar power device with temperature protection, in accordance with the present invention as described above, to a fluorescent lamp driving system. The circuit of FIG. 8 is known to those skilled in the art as lamp-ballast. In FIG. 8 LAMP indicates a fluorescent lamp. A simplified circuit for driving of the lamp LAMP comprises a transformer having a primary winding P in series with the lamp LAMP, and with an inductive load L and a capacitor C. Two bipolar power devices represented by blocks both indicated by the letter A are inserted in series between a first and second power supply lines VA and VB. A first and second secondary windings S1 and S2 of the transformer are in parallel with the two blocks, respectively with the lower and upper blocks. An intermediate terminal between the two blocks A is connected to the primary winding P. The driving circuit comprises also a striking circuit of known type. The striking function is fulfilled by a diode DIAC connected to the lower block A. The circuit also comprises the circuit elements D20, R21 and C20 connected through a rectifier between the power devices A and an alternating input current line.

In practice the alternating input current is rectified and stabilized on the capacitor C10. Striking of the lower block A takes place by means of the diode DIAC which receives current from a circuit RC connected in parallel with the capacitor C10 and comprising the elements C20 and R21. The diode D20 disables the striking circuit.

The lamp-ballast circuit is a self-oscillating circuit with half-bridge. The current is switched for a half-period onto the lower block A and for the other half-period onto the upper block A by means of the secondary windings S1 and S2 which are inverted-phase operated.

The application requires fast switching of the power devices A to reduce losses. For this application it is therefore preferable to provide a device having a power stage in the configuration of FIG. 3. The use of such a configuration including an auxiliary MOS transistor permits achieving high performance in the switching phase and especially lower storage times.

The power device in accordance with the present invention also advantageously permits reduction of the number of components which the user must include in the application circuit compared with the case in which a power device without integrated thermal protection is used.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. Monolithically integrated bipolar power device for driving electrical loads, comprising:
    a die,
    a power stage, integrated on the die, including a high-voltage bipolar transistor inserted between a first power supply terminal and a second power supply terminal of the device, and having at least one control node,
    a driver circuit of the power stage having at least one output coupled to the at least one control node of the power stage and an input coupled to an input terminal of the device, and
    a thermal protection circuit, integrated on the die, including:
        a) a temperature sensing circuit for generating a signal dependent on the temperature present in the device,
        b) a comparator circuit having a first input coupled to the temperature sensing circuit to receive said signal, a second input coupled to a node kept at a reference potential independent of temperature and at least one output, and
        c) at least a first switch circuit coupled between said output of the comparator circuit and the at least one control node of the power stage and interlocked with the output of the comparator to generate at its output a cut off signal when the device temperature exceeds a preset maximum value.

2. Device in accordance with claim 1 in which said power stage includes a low-voltage auxiliary transistor cascade-connected to said high-voltage transistor, wherein said first switch circuit is coupled to a control node of said auxiliary transistor.

3. Device in accordance with claim 2, further comprising a second switch circuit inserted between the output of the comparator circuit and a control node of said driver circuit and interlocked with the output of the comparator.

4. Device in accordance with claim 3, wherein said driver circuit comprises, between the input terminal of the device and the auxiliary transistor, means for decoupling the auxiliary transistor from said input terminal when a predetermined voltage is applied on the input terminal, said means for decoupling having a control node coupled to the control node of the driver circuit.

5. Device in accordance with claim 4, wherein said means for decoupling comprises at least one switch coupled to the control node of the auxiliary transistor.

6. Device in accordance with claim 3, wherein said second switch circuit is fed through said input terminal of the device.

7. Device in accordance with claim 6, wherein said first switch circuit and said second switch circuit comprise respective input transistors interlocked with respective outputs of said comparator circuit and respective output transistors controlled by said input transistors and coupled respectively to the control node of the auxiliary transistor and to the control node of said driver circuit.

8. Device in accordance with claim 1, wherein said temperature sensing circuit and said comparator circuit are incorporated in a single differential stage.

9. Device in accordance with claim 8, further comprising a second switch circuit inserted between the output of the comparator circuit and a control node of said driver circuit and interlocked with the output of the comparator, and wherein said differential stage comprises first and second branches coupled between said node kept at the reference potential and said first and second switch circuits and having respective junctions defining potential drops variable with temperature and coupled in parallel between said node kept at the reference potential and a constant voltage node, in such a manner that the first and second branches switch to conduction when the temperature of the device exceeds said preset maximum value.

10. Device in accordance with claim 1, further comprising a circuit for generating at said node kept at reference potential the reference potential independent of temperature.

11. Device in accordance with claim 10, wherein said circuit for generating the reference potential is of the band-gap type.

12. Device in accordance with claim 10, wherein said circuit for generating the reference potential comprises a current mirror fed by said input terminal of the device and having an input branch receiving a first current proportional to an input current and an output branch through which flows a second current proportional to said first current, and a transistor controlled by said second current and coupled to a reference node, wherein the variation with the temperature of the difference between the base-emitter voltages of said current mirror is such as to compensate for the variation with the temperature through the base-emitter junction of said transistor in such a manner that the potential present on said reference node is independent of temperature.

13. Device in accordance with claim 1, wherein said driver circuit and said thermal protection circuit are fed by said input terminal.

14. Circuit for driving a fluorescent lamp, comprising:

a transformer having a primary winding in series with the lamp and first and second secondary windings, first and second bipolar power devices arranged to drive the lamp, both of the first and second bipolar power devices being coupled in series between first and second power supply lines and coupled in parallel respectively with the first and the second secondary windings, an intermediate terminal between said bipolar power devices being coupled to said primary winding, and a striking circuit functionally coupled to said first and second power devices to activate them, wherein said first and second power devices are provided in accordance with claim 1.

15. Device in accordance with claim 1, wherein the driver circuit is integrated on the die.

16. Device in accordance with claim 1, wherein the first power supply terminal, the second power supply terminal and the input terminal of the device interface with the die and are adapted to interface with circuitry external to the device.

* * * * *

UNITED STATES PATENT AND TRADEMARK OFFICE
CERTIFICATE OF CORRECTION

PATENT NO. : 6,051,933
DATED : April 18, 2000
INVENTOR(S) : Natale Aiello, Atanasio La Barbera and Sergio Palara It is certified that error appears in the above-identified patent and that said Letters Patent is hereby corrected as shown below:

On the title page, item [75] should read:

[75] Inventors: Natale Aiello, Catania; Atanasio La Barbera, Palmero; Sergio Palara, Acitrezza, all of Italy Signed and Sealed this Twentieth Day of March, 2001

Attest:

NICHOLAS P. GODICI

*Attesting Officer*     *Acting Director of the United States Patent and Trademark Office*

UNITED STATES PATENT AND TRADEMARK OFFICE
CERTIFICATE OF CORRECTION

PATENT NO. : 6,051,933
DATED : April 18, 2000
INVENTOR(S) : Natale Aiello, Atanasio La Barbera and Sergio Palara Page 1 of 1

It is certified that error appears in the above-identified patent and that said Letters Patent is hereby corrected as shown below:

Title page,
Item [75] should read:

-- Item [75] Inventors: Natale Aiello, Catania; Atanasio La Barbera, Palmero; Sergio Palara, Acitrezza, all of Italy --

Signed and Sealed this

Ninth Day of October, 2001

Attest:

*Nicholas P. Godici*

*Attesting Officer*

NICHOLAS P. GODICI
*Acting Director of the United States Patent and Trademark Office*